United States Patent [19]

Ben-David

[11] Patent Number: 5,650,076
[45] Date of Patent: Jul. 22, 1997

[54] LASER PLOTTER

[75] Inventor: Ilan Ben-David, Petach Tikva, Israel

[73] Assignee: Scitex Corporation Ltd., Herlia B, Israel

[21] Appl. No.: 296,618

[22] Filed: Aug. 26, 1994

[30] Foreign Application Priority Data

Sep. 8, 1993 [IL] Israel ......................................... 106952

[51] Int. Cl.⁶ .................................................. B23K 26/08
[52] U.S. Cl. .............................. 219/121.7; 219/121.77; 219/121.8; 347/260
[58] Field of Search ................. 219/121.61, 121.67, 219/121.68, 121.7, 121.74, 121.76, 121.77, 121.8, 121.78; 346/107.1, 107.6, 138; 347/225, 256, 257, 260, 262; 359/200, 204, 212, 226; 358/297, 299; 264/400, 482

[56] References Cited

U.S. PATENT DOCUMENTS

| | | | |
|---|---|---|---|
| 3,396,401 | 8/1968 | Nonomura | 219/121.67 |
| 3,549,858 | 12/1970 | Larive et al. | |
| 3,832,948 | 9/1974 | Barker | 219/121.69 |
| 4,245,228 | 1/1981 | Cook | |
| 4,257,053 | 3/1981 | Gilbreath | |
| 4,307,282 | 12/1981 | Gappa | |
| 4,686,541 | 8/1987 | Rosier | 347/260 |
| 4,853,709 | 8/1989 | Stein et al. | 359/212 |
| 5,103,456 | 4/1992 | Scifres et al. | 372/50 |
| 5,151,813 | 9/1992 | Yamamoto et al. | 264/482 |
| 5,179,463 | 1/1993 | Kramer | 359/204 |
| 5,198,843 | 3/1993 | Ito et al. | 347/256 |
| 5,345,870 | 9/1994 | Bailey et al. | 101/463.1 |
| 5,488,906 | 2/1996 | Iron et al. | 346/138 |

FOREIGN PATENT DOCUMENTS

| | | |
|---|---|---|
| 22063479 | 9/1992 | Canada |
| 2063479-A1 | 9/1992 | Canada |
| 2 443 396 | 11/1979 | France |
| 59-107783 | 6/1984 | Japan |
| 62-282977 | 12/1987 | Japan |
| 2039018 | 2/1990 | Japan |
| 2-175267 | 7/1990 | Japan |
| 5-192779 | 8/1993 | Japan ............... 219/121.61 |

OTHER PUBLICATIONS

Kellogg et al., "CREO/Crosfield Interface for Infrared Diode Thermal Imaging", Journal of Imaging Science and Technology, vol. 36, No. 3, May/Jun. 1992, pp. 220–224.

Primary Examiner—Teresa J. Walberg
Assistant Examiner—Gregory L. Mills
Attorney, Agent, or Firm—Skjerven, Morrill, MacPherson, Franklin & Friel LLP; Forrest E. Gunnison

[57] ABSTRACT

A laser plotter having the ability to cut registration holes while the medium is in a plotting location within the laser plotter is disclosed. The plotter includes laser plotting apparatus and laser cutting apparatus whose axes of rotation are identical. The laser plotting and laser cutting apparatus can utilize the same or different optical paths. The laser plotting apparatus can perform raster and vector scanning motions.

20 Claims, 9 Drawing Sheets

LASER PLOTTER

FIELD OF THE INVENTION

The present invention relates to hole punch systems for laser plotters generally and to laser hole cutting systems for such plotters in particular.

BACKGROUND OF THE INVENTION

In the printing world, after artwork has been plotted onto a film, the artwork is transferred to a printing plate typically via a contact process. The printing plate is later to be placed on a printing press. In order to ensure that the artwork is registered properly on the material to be printed, the film must be properly registered on the printing plate.

In order to properly register the film on the printing plate, registration holes, corresponding to registration pins on the printing press and located outside of the area of the artwork, are punched out of the film prior to placing it on the printing plate.

A film which it is desired to cut is illustrated in FIG. 1 to which reference is now made. The page has artwork 8 around which are round holes 10 and oval holes 12 on the outer edges of the film, a line 13 indicating where the film should be cut to create two separate films and round holes 14 next to the line 13 for providing holes on the "inner" edges of the two separate films.

The punching can occur before or after placing the film into the plotter, or while the film is within the plotter.

For punching after the film has exited the plotter, a separate punch and die unit is typically utilized. Such units register the holes 10 or 12 with respect to the artwork 8 thereon either manually or via a cross-haired vision system.

If the holes are punched prior to plotting, the film, which has registration holes, is registered on the plotting surface (a drum or a flat surface) with registration pins which match the registration holes. The plotting of the artwork is then designed to be registered to the locations of the registration pins. However, there exist many types of films with many different types of holes and each plotter has a fixed and limited number of hole types to which it conforms.

Plotters which have hole punching units within them are also known. One such plotter, a punch and die unit formed within an external drum plotter, is described in Canadian Patent Publication A1-2,063,479 to Ben-David et al, incorporated herein by reference. Prior to plotting, the punch and die units are placed in desired locations and thereafter, the artwork 8 is formed on the film in precise registration with the location of the punch and die unit. Punching can occur at any appropriate time, before or after plotting.

The Background of '479 describes many other types of hole cutting systems which, therefore, will not be described herein.

The system described in '479 solves the problem of registration. However, it is inflexible and is only operative with one type of printing press.

Either of holes 10 and 12 can be produced by the system of '479, but not both by the same plotter. Holes 14 probably could be produced by the system of '479, but probably not by other types of systems.

A plotter having a punch and die unit similar to that described in '479 is useful for producing films for only a limited number of types of plates. As many print shops work with a plurality of printing presses, such a system is not practical.

It is noted that, after the holes 10–14 have been produced, the film is brought to a film cutter which separates the film into two films by cutting along line 13.

SUMMARY OF THE PRESENT INVENTION

It is therefore an object of the present invention to provide a plotter which has the ability to cut holes of different sizes that are registered with the artwork on a film.

It is also an object to provide a plotter with the ability to cut a film into more than one separate film.

It is a further object of the present invention to provide a multi-wavelength plotter which performs plotting and cutting.

There is therefore provided, in accordance with a preferred embodiment of the present invention, a laser plotter including laser plotting apparatus for plotting artwork onto a plotting medium and laser cutting apparatus for cutting holes in the plotting medium in registration with the artwork. The laser plotting apparatus includes a plotting beam scanning apparatus with a first axis of rotation and the laser cutting apparatus includes a cutting beam scanning apparatus with a second axis of rotation. The two axes of rotation are the same.

In one embodiment of the present invention, the laser plotter includes a single laser wherein the plotting apparatus and the cutting apparatus are combined. Such a single laser preferably is a master oscillator/power amplifier (MOPA) laser diode.

Additionally, in accordance with the first preferred embodiment of the present invention, the plotter includes a beam processing unit which selectively provides cutting and plotting beams from the single input beam. In one embodiment, the two beams are differentiated by spot size. In another, they are differentiated by wavelength, thereby providing a multiwavelength plotter for cutting and plotting purposes.

The cutting and plotting beams are preferably provided along the same optical path.

In one version of the first embodiment, the beam processing unit includes a beam frequency changer for selectively producing a plotting beam having a smaller frequency than an input cutting beam. The beam frequency changer preferably includes a crystal for producing the plotting beam.

In a second version of the first embodiment, the beam processing unit includes a beam spot size changer for selectively producing a plotting beam having a large spot size and a cutting beam having a small spot size.

Furthermore, in accordance with a second preferred embodiment of the present invention, the plotter includes dual mode beam scanning apparatus for selectively scanning the cutting and plotting beams. Preferably, the dual mode scanning apparatus includes 1) a scanning element, 2) a first motor for use during cutting, 3) a second motor for use during plotting which has an axle to which the scanning element is attached, and 4) a coupling for coupling the first motor to the axle during cutting.

Additionally, in accordance with a third preferred embodiment of the present invention, there are two laser sources, a low power one for plotting and high power one for cutting. The high power laser source is typically a MOPA laser diode.

In accordance with another preferred embodiment of the present invention, the plotter additionally includes waste removal apparatus located away from a plotting and cutting area. The waste removal means typically includes a cutting edge.

In accordance with a preferred embodiment of the present invention, the laser cutting apparatus is also operative to cut lines in the plotting medium.

It is a further object of the present invention to provide a plotter having vector and raster scanning motions. There is therefore provided, in accordance with a preferred embodiment of the present invention, a laser plotter including a) at least one laser source and its associated optics for producing a scanning beam, b) raster scanning apparatus and c) vector scanning apparatus. The raster and vector scanning apparatus can be separate or combined. If they are combined, they include a) a scanning element, b) a first motor having an axle attached to the scanning element, c) a second motor, d) a coupling for selectively coupling the second motor to the axle and e) translation apparatus having a carriage on which the first and second motors, coupling and scanning element lie, for translating the carriage, wherein the first motor and translation apparatus provide raster motion and the second motor and translation apparatus provide vector motion.

There is also provided, in accordance with a preferred embodiment of the present invention, a method for cutting registration holes in a plotted medium. The method includes the step of cutting the registration holes with a laser cutting system while the plotted medium is in a plotting location.

Additionally, in accordance with a preferred embodiment of the present invention, the step of cutting is typically performed by directing a cutting beam along a path followed by a plotting beam. The spot of the cutting beam preferably follows a cutting pattern formed of two cuts having at least one gap therebetween.

Finally, in accordance with a preferred embodiment of the present invention, the method includes a step of cutting the gap with a cutting edge, thereby removing the waste defined by the cutting pattern and gap.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 2:
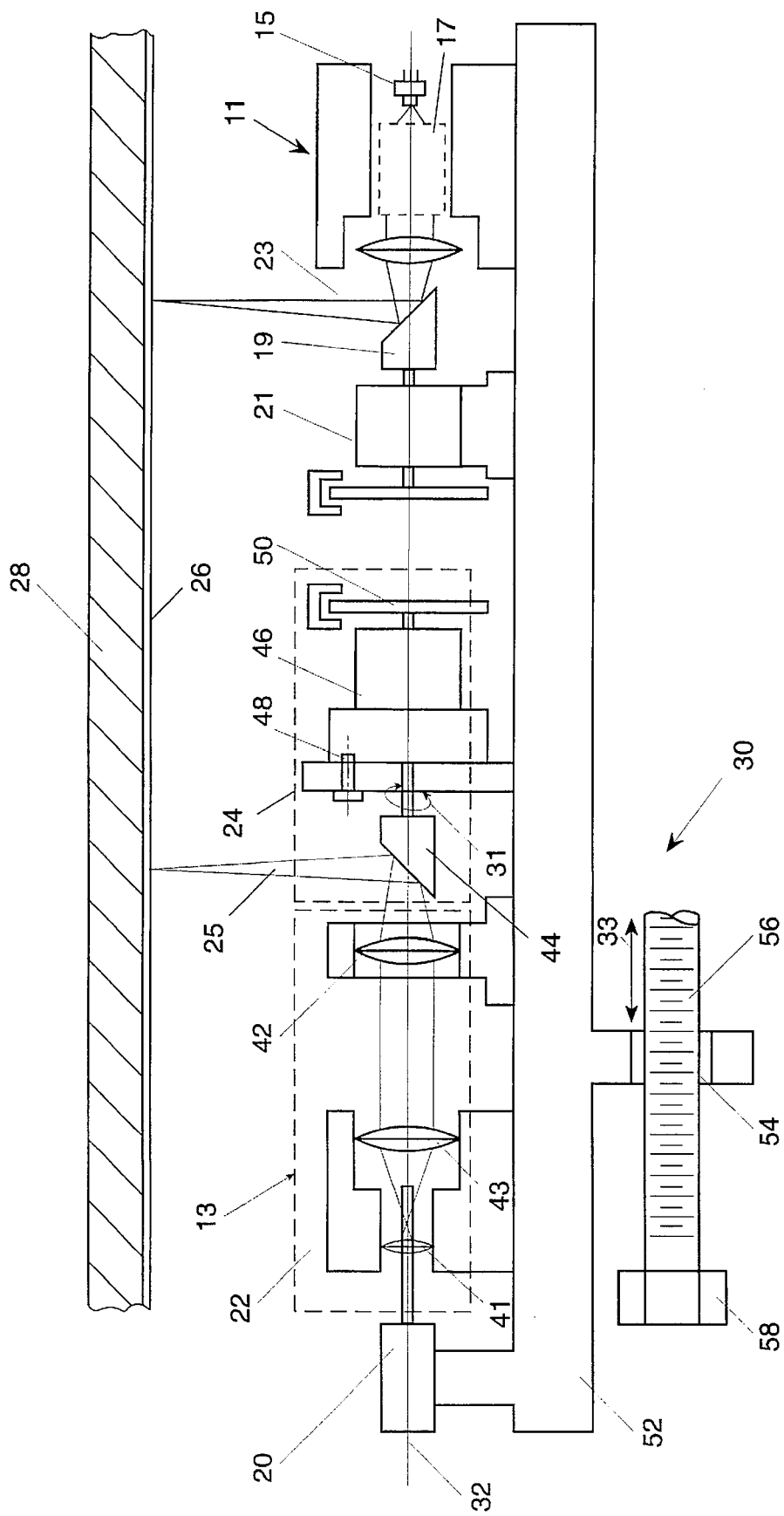
FIG. 2 is a schematic illustration of a laser plotter having a laser registration hole cutting system, constructed and operative in accordance with a preferred embodiment of the present invention.

Reference is now made to FIG. 2 which schematically illustrates a first embodiment of the laser plotter having the registration hole cutting system of the present invention. The Figs. and most of the embodiments described herein illustrate an internal drum plotter; however, the concepts of the present invention can be readily applied to other types of plotters and such application is included within the scope of the present invention.

The laser plotter of the present invention typically comprises a plotting system 11 for plotting artwork and a cutting system 13 for cutting the registration holes in accordance with the location of the artwork, both systems located on one translation apparatus 30. Typically, the two systems operate at different times; the plotting system 11 is operative during plotting of the artwork and the cutting system 13 is operative either before or afterwards.

The plotting system 11 can be any suitable plotting system and therefore, will not be described herein in detail. It is noted that the plotting system 11 typically comprises standard elements such as a plotting laser source 15 (HeNe, Argon or diode laser), associated optics 17, a rotatable plotting beam scanning device 19, such as a mirror or a prism, and its associated motor apparatus 21.

The plotting beam scanning device 19 scans a plotting beam 23 across a line of a plotting medium 26 placed on the internal surface of a drum 28. During scanning, the translation apparatus 30 translates forward such that, at the end of the scan line, the plotting beam 23 has moved forward the width of one plotted line. This is known as raster scanning.

Once the entire artwork has been plotted, the translation apparatus 30 returns to an initial starting point for plotting. In accordance with the present invention, the cutting system 13 is operative during the return movement. Alternatively, the cutting system 13 can be operative at any other non-plotting time.

The cutting system 13 typically comprises a cutting laser source 20 for producing a laser beam, beam shaping optics 22 for shaping the laser beam and cutting beam scanning apparatus 24 for scanning the shaped laser beam, called the "cutting beam" and labeled 25, along a line on the plotting medium 26.

In order to register the operations of the plotting and cutting systems 11 and 13, respectively, with each other, the plotting beam scanning device 19 and the cutting beam scanning apparatus 24 rotate about the same axis, labeled 32.

The cutting beam scanning apparatus 24 and the translation apparatus 30 are both under separate control of a microprocessor (not shown) which directs them to desired positions, providing thereby a vector scanning ability whose degrees of freedom, marked by arrows 31 and 33, are independent.

The vector movement of the cutting beam 25 enables the cutting system 13 to cut lines and holes of any desired shape, number and location. This flexibility is not found in the prior art.

The cutting laser source 20 can be any laser source which has a power density large enough to cut the medium 26. Such a laser source can be a $CO_2$ laser, having a wavelength of 10.6 μm and located outside of the drum 28.

Alternatively, cutting laser source 20 can be a master oscillator/power amplifier (MOPA) diode laser, such as the single mode diffraction limited SDL-5762 MOPA diode laser manufactured by Spectra Diode Labs of San Jose, Calif. The SDL-5762 is a 1 W laser source and provides a diffraction limited 985 nm wavelength beam.

Beam shaping optics 22 typically comprises a beam expander, formed of at least two lenses 41 and 43, and a focussing lens 42 for focussing the beam onto the internal surface of the drum 28 on which lies the medium 26.

The cutting beam scanning apparatus 24 typically comprises a rotatable mirror or prism 44 for directing the beam from the axis 32 to the internal surface of the drum 28. Apparatus 24 typically also comprises rotating apparatus, such as a stepper motor 46, gear 48 and stepper motor encoder 50, for rotating the mirror 44 to desired locations.

It is noted that the gear 48 is placed on the opposite side of the stepper motor 46 from the encoder 50, thereby to increase the resolution read by the encoder. If gear 48 has a 20:1 ratio, the stepper motor 46 performs 200 steps/revolution, the encoder 50 measures 2000 lines/revolution, and the radius of drum 28 is 125 mm, the cutting system 13 will have a resolution of 20 μm on the drum 28.

Translation apparatus 30 typically comprises a carriage 52 to which the plotting and cutting systems 11 and 13, respectively, are attached, a nut 54 which is integrally attached to the carriage 52, a lead screw 56 which rotates within nut 54, thereby causing carriage 52 to translate, and a stepper motor 58 which rotates lead screw 56.

If the pitch of the lead screw is 2.5 mm, the stepper motor 58 performs 200 steps/revolution and is driven by a driver (not shown) in microsteps, the resolution of the translation apparatus 30 will be 0.3 μm.

Figure 3A:
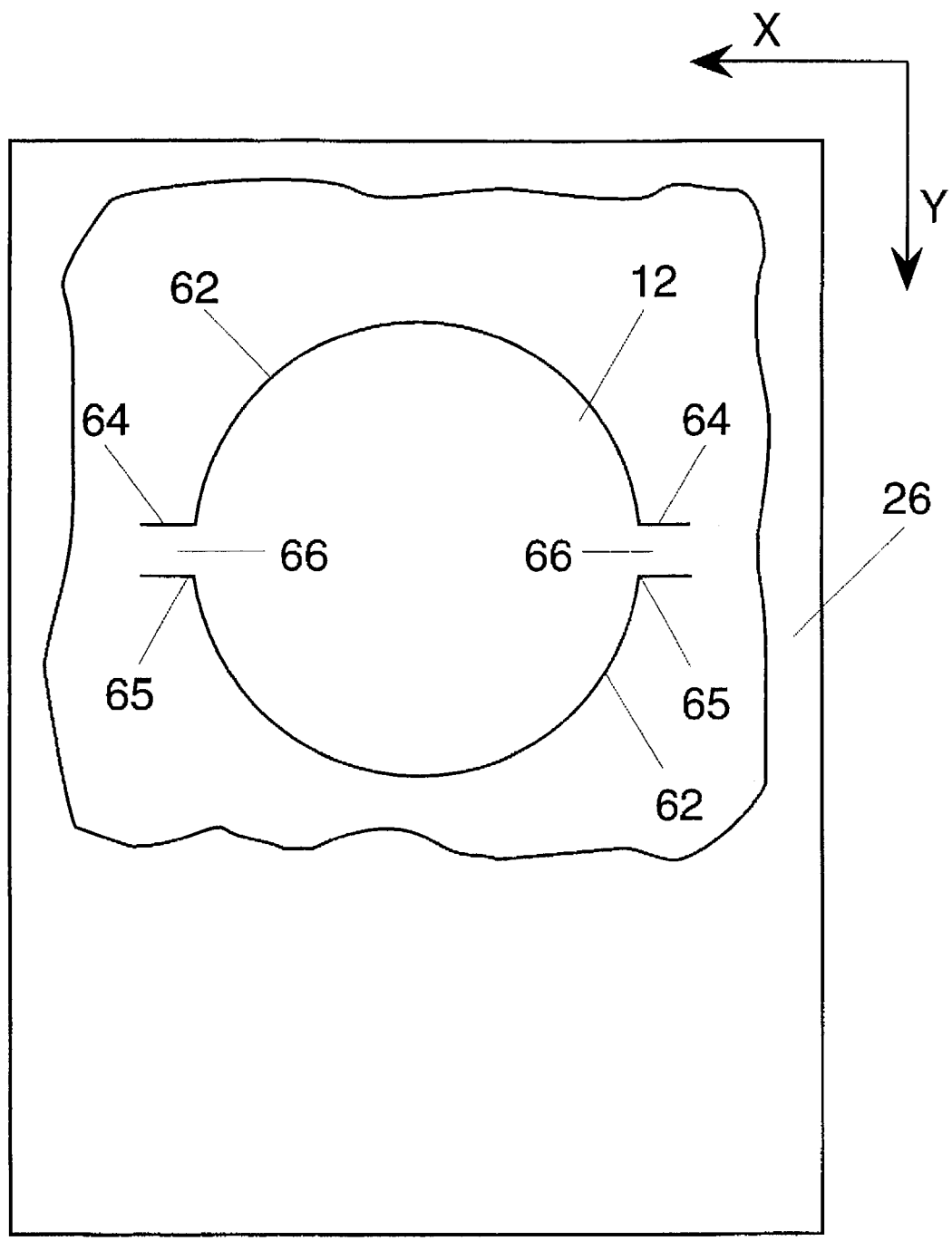
FIG. 3A is a schematic illustration of a cutting pattern for the registration holes produced by the cutting system of FIG. 2.
Figure 3B:
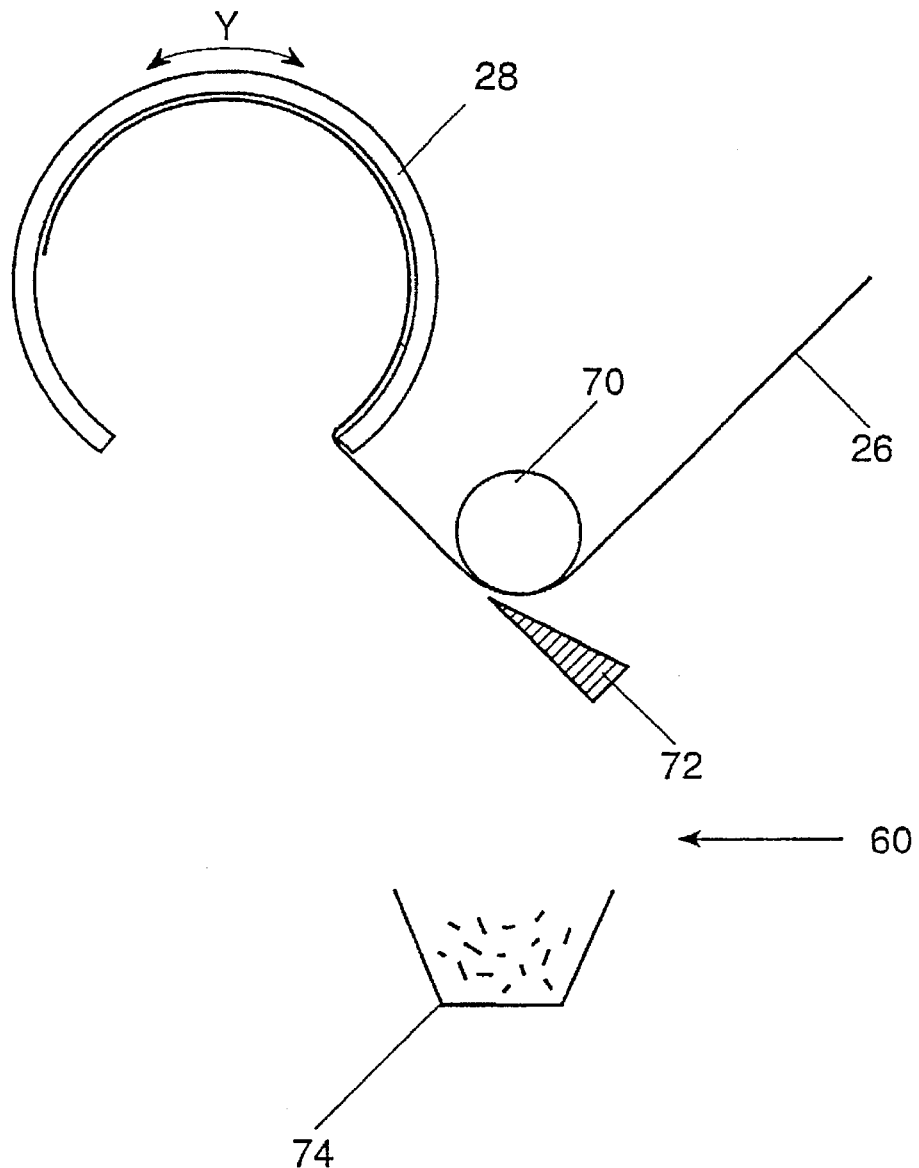
FIG. 3B is a schematic, isometric illustration of a waste removal system forming part of the laser plotter of the present invention.
Figure 3C:
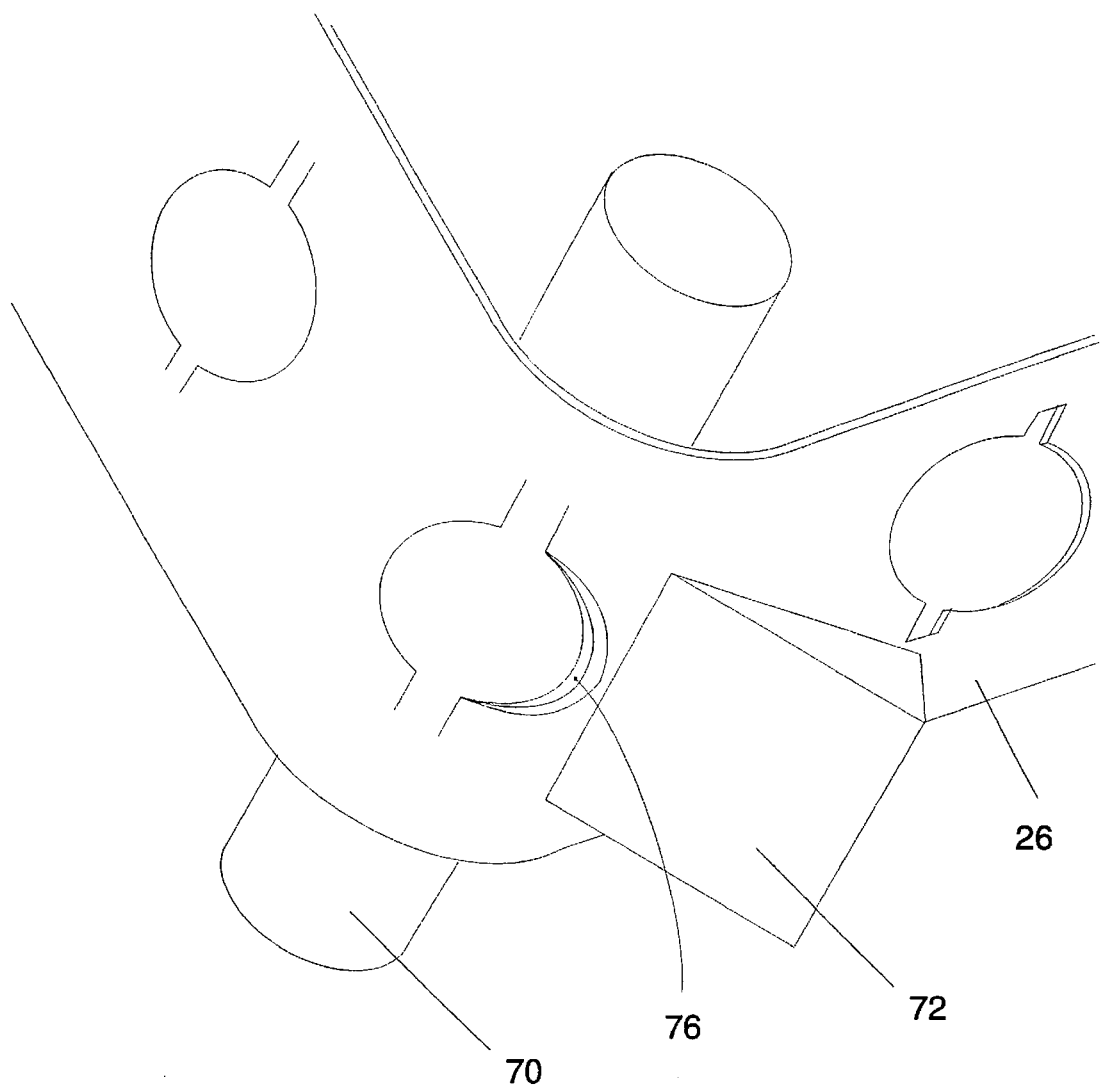
FIG. 3C is an isometric illustration of a cutting edge of the waste removal system of FIG. 3B as it performs a cut.

Reference is now made to FIGS. 3A–3C. FIG. 3A illustrates a cutting pattern for registration holes (where registration hole 12 is illustrated). FIG. 3B schematically illustrates a waste removal system 60 and FIG. 3C isometrically illustrates a portion of the waste removal system 60.

In accordance with the present invention, the cutting system of the present invention cuts the registration holes 10–14 in two cuts 62. As shown in FIG. 3A, each cut 62 follows half the shape of the relevant registration hole 12 and adds a short extension, labeled 64, at the ends 65 of the cut. The short extensions 64 of one cut 62 are parallel to those of the other cut 62 with a gap 66, typically of a small size, such as 0.5 mm, between them. The short extensions 64 typically extend in a direction perpendicular to the direction of movement, marked as the Y direction, of the medium 26 as it exits the drum 28.

When the waste removal system 60 cuts between adjacent ends 65, the outline of hole 12 is completed and the material within the hole 12, the waste material, can be removed. It will be appreciated that the cutting pattern illustrated in FIG. 3A allows most of the cutting to be performed while the medium 26 is positioned for plotting and allows the medium 26 to be moved to a second location, away from the optics of the plotting and cutting systems, where the waste material can be removed. Thus, the present invention maintains the area of the plotting system clean.

As shown in FIG. 3B, the waste removal system 60 typically is located beside the drum 28 and comprises a roller 70 having a relatively small diameter, such as 10 mm, a cutting edge 72 for cutting between ends 65 and a bucket 74 for receiving the waste material. Cutting edge 72 can be a knife or a sharp edge of any appropriate type of hard material.

As the medium 26 rolls past the roller 70 (detailed in FIG. 3C), most of the medium bends to the curvature of the roller 70. However, the partially attached waste material, herein labeled 76, does not bend but rather becomes tangent to the surface of the roller 70. As the medium 26 moves past the cutting edge 72, waste material 76 is pushed against cutting edge 72 enabling it to cut the gap 66 and causing the removed waste material to fall into the bucket 74.

Figure 1:
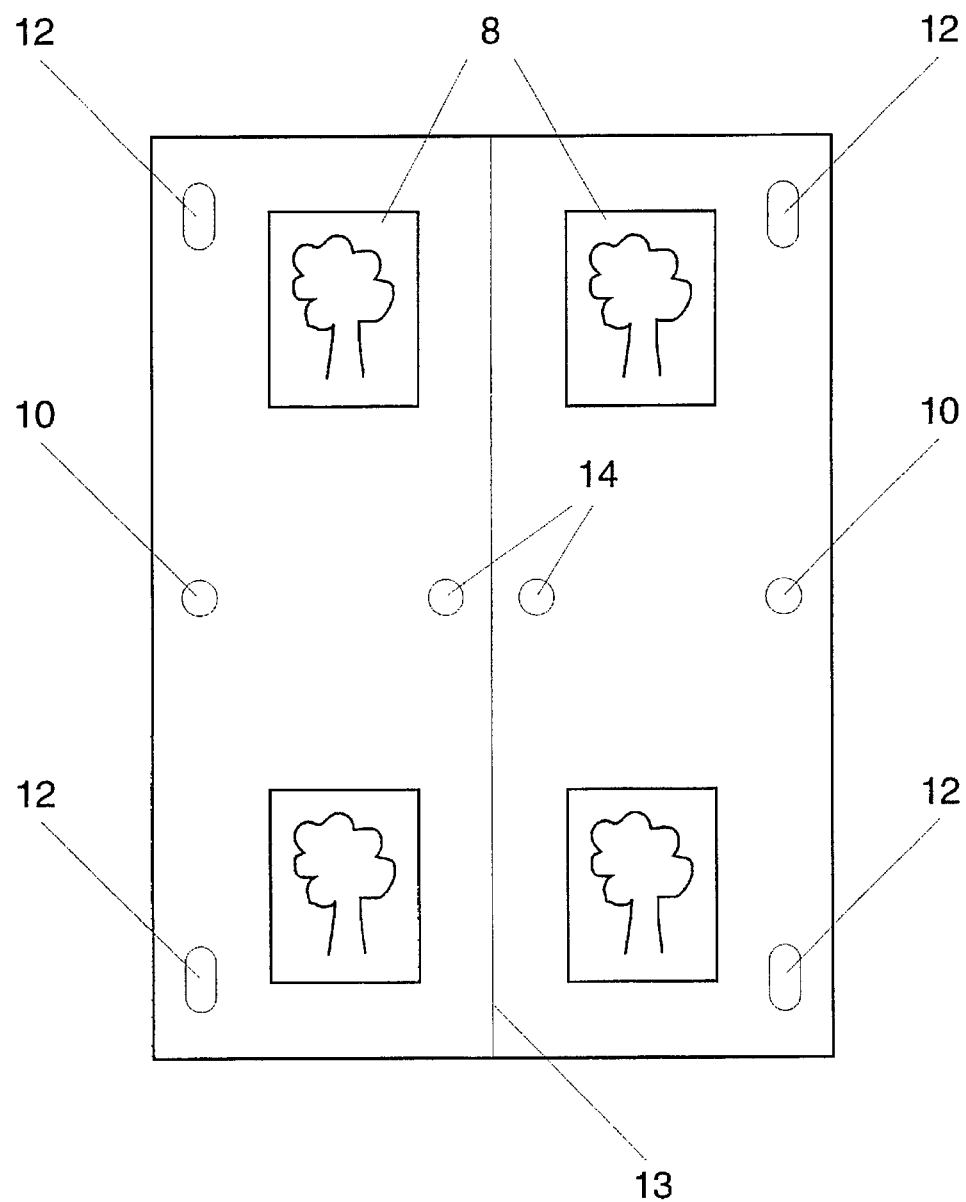
FIG. 1 is a pictorial illustration of a plotted film having a plurality of holes of different shapes cut therefrom.

It is noted that the system of the present invention is also operative to cut along line 13 of FIG. 1, thereby to separate the medium 26 into two smaller media.

Figure 4:
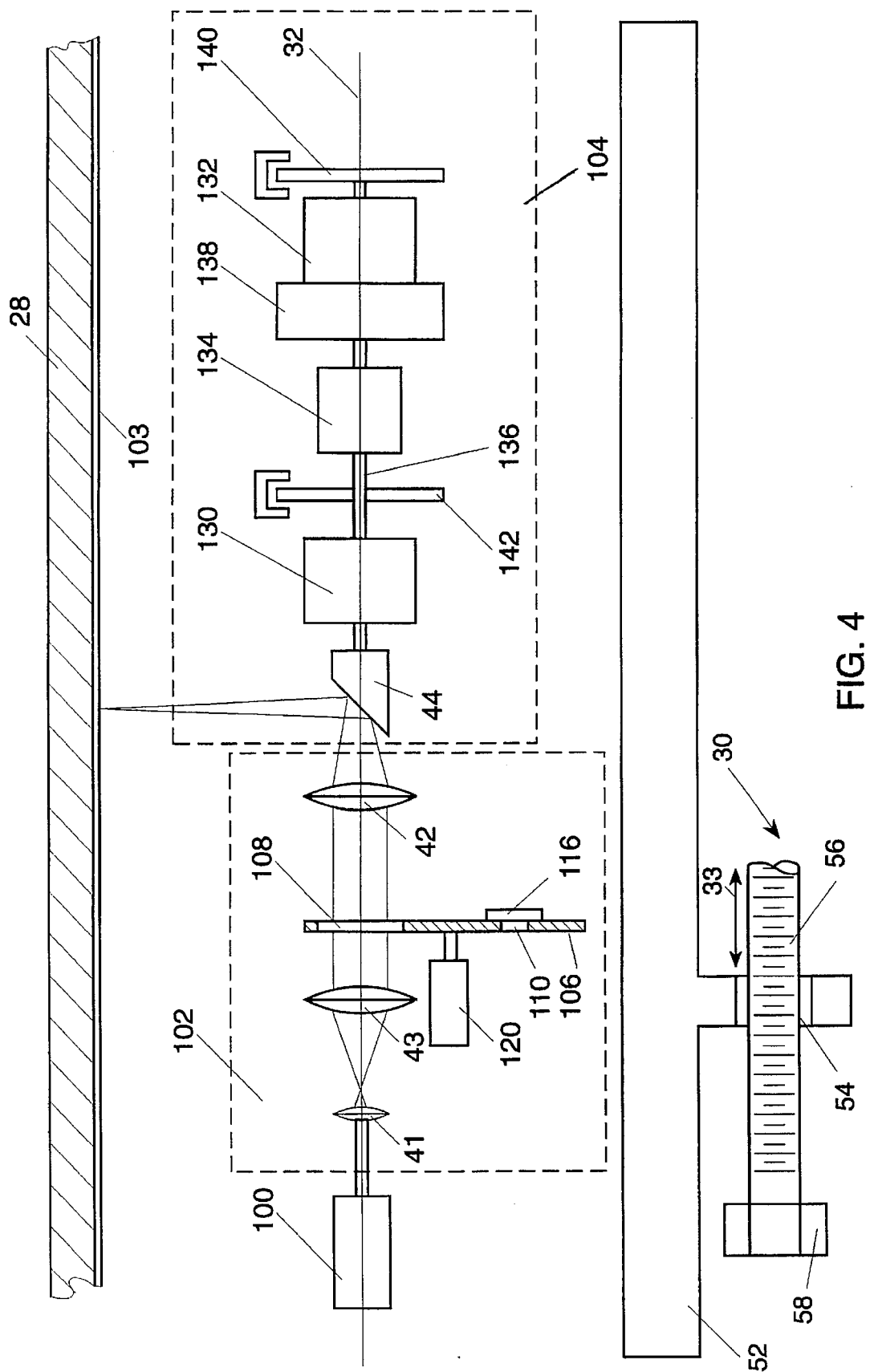
FIG. 4 is a schematic illustration of a combined plotting and cutting system, constructed and operative in accordance with a second preferred embodiment of the present invention.
Figure 5:
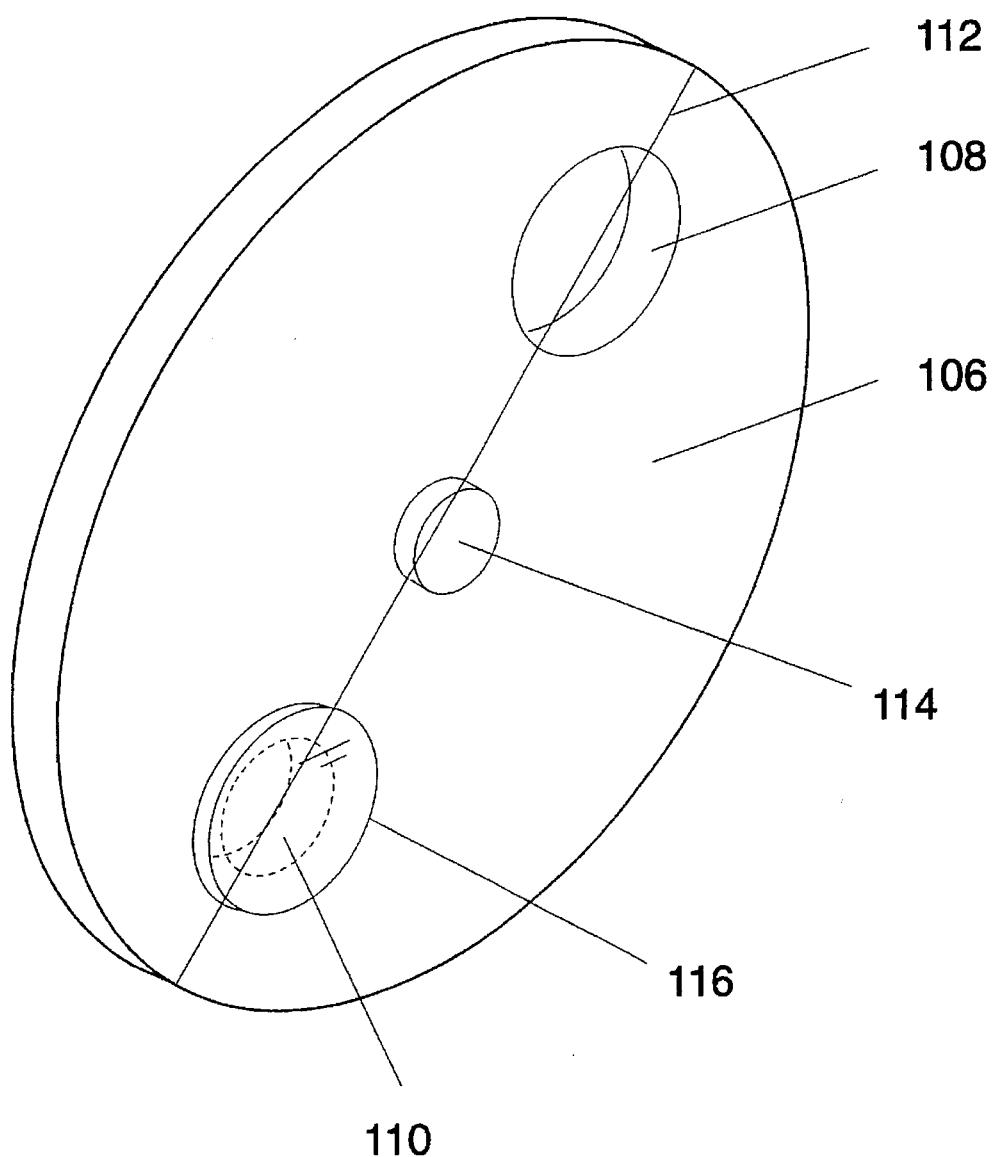
FIG. 5 is an isometric illustration of a filter wheel useful in the system of FIG. 4.

Reference is now made to FIGS. 4 and 5 which illustrate an alternative embodiment of the present invention having a single, combined plotting and cutting system. In this embodiment, a single laser source is utilized wherein its laser beam is processed to become a cutting or a plotting beam. Both plotting and cutting beams follow generally the same optical path.

Those elements of this embodiment which are similar to those of the previous embodiment have the same reference numerals and will not be described in detail.

The second embodiment typically comprises a single laser source 100, dual mode beam shaping optics 102 for shaping and filtering the laser beam and dual mode cutting beam scanning apparatus 104 for rotatably directing the shaped laser beam towards medium 26. The elements 100, 102 and 104 are located on translation apparatus 30.

The laser source 100 has to be capable of producing a laser beam which can be shaped to be both the plotting beam 23 and the cutting beam 25. Such a laser source is the single mode diffraction limited SDL-5762 MOPA diode laser manufactured by Spectra Diode Labs.

The beam shaping optics 102 produce the cutting and plotting beams 23 and 25, respectively, by varying the shape of the laser beam spot. A tight spot is utilized for cutting and a wide spot is utilized for plotting. Since the wavelength of both laser beams is 985 nm which is not within the visible range to which standard film is sensitive, the medium, labeled 103, to be utilized in this embodiment is a thermal imaging film, such as is briefly mentioned in the article "CREO/Crosfield Interface for Infrared Diode Thermal Imaging", by R. E. Kellogg, et al, published in the *Journal of Imaging Science and Technology*, Vol. 36, No. 3, May/June 1993, pp. 220–224. The article is incorporated herein by reference.

Optics 102 typically comprises lenses 41, 43 and 42 as well as a dual mode spot shaper 106, shown in detail in FIG. 5, for varying the spot size of the laser beam.

The shaper 106 typically comprises two holes 108 and 110, equidistant along a diameter 112 of shaper 106 from an axis of rotation 114. Hole 108 is utilized during cutting and is typically empty in order not to affect the laser beam which already has the desired small cutting spot size. Hole 110 is utilized during plotting and is typically smaller than hole 108. Over hole 110 is a filter 116, operative to reduce the size and/or power of the laser beam, thereby to increase the size of the spot to that of a plotting spot.

Shaper 106 is typically attached to a motor 120, operative to rotate shaper 106 around its axis 114 thereby to bring its two holes 108 and 110 into position.

Because plotting requires very high speed scanning while cutting requires positional accuracy, both of which cannot be provided by a single type of motor, the beam directing apparatus 104 typically comprises two motors, a smooth motor 130, such as an AC hysteresis or a DC brushless motor, for plotting and a stepper motor 132 for cutting. The smooth motor 130 is directly attached to the rotatable mirror 44 and the stepper motor 132 is coupled to the spinner motor 130 via a two axis coupling 134, such as the S90MPA-C14D19 manufactured by Stock Drive Products of New Hyde Park, N.Y., USA. Coupling 134 is electromagnetic and provides coupling only when current is applied to it. The smooth motor 130 will be called herein the "spinner motor 130" since it operates the rotatable mirror 44.

During plotting, the stepper motor 132 is decoupled from the active spinner motor 130. During cutting, the stepper motor 132 is coupled to an axis 136 of spinner motor 130 via coupling 134. To do so, coupling 134 is activated and no power is provided to spinner motor 130, thereby enabling its axis 136 to rotate freely.

In order to provide motors 130 and 132 with the required resolution, apparatus 104 typically additionally comprises a gear 138 and a stepper encoder 140 attached to the axis of the stepper motor 132 and a spinner motor encoder 142 attached to axis 136 of the spinner motor 130.

The two encoders 140 and 142 have to be synchronized with each other; otherwise, the two systems will not be registered. Therefore, when changing from the plotting to the cutting mode, the system of the present invention performs at least one rotation wherein the two motors are coupled together. The output of both encoders 140 and 142 are read and an offset between them established.

Figure 6:
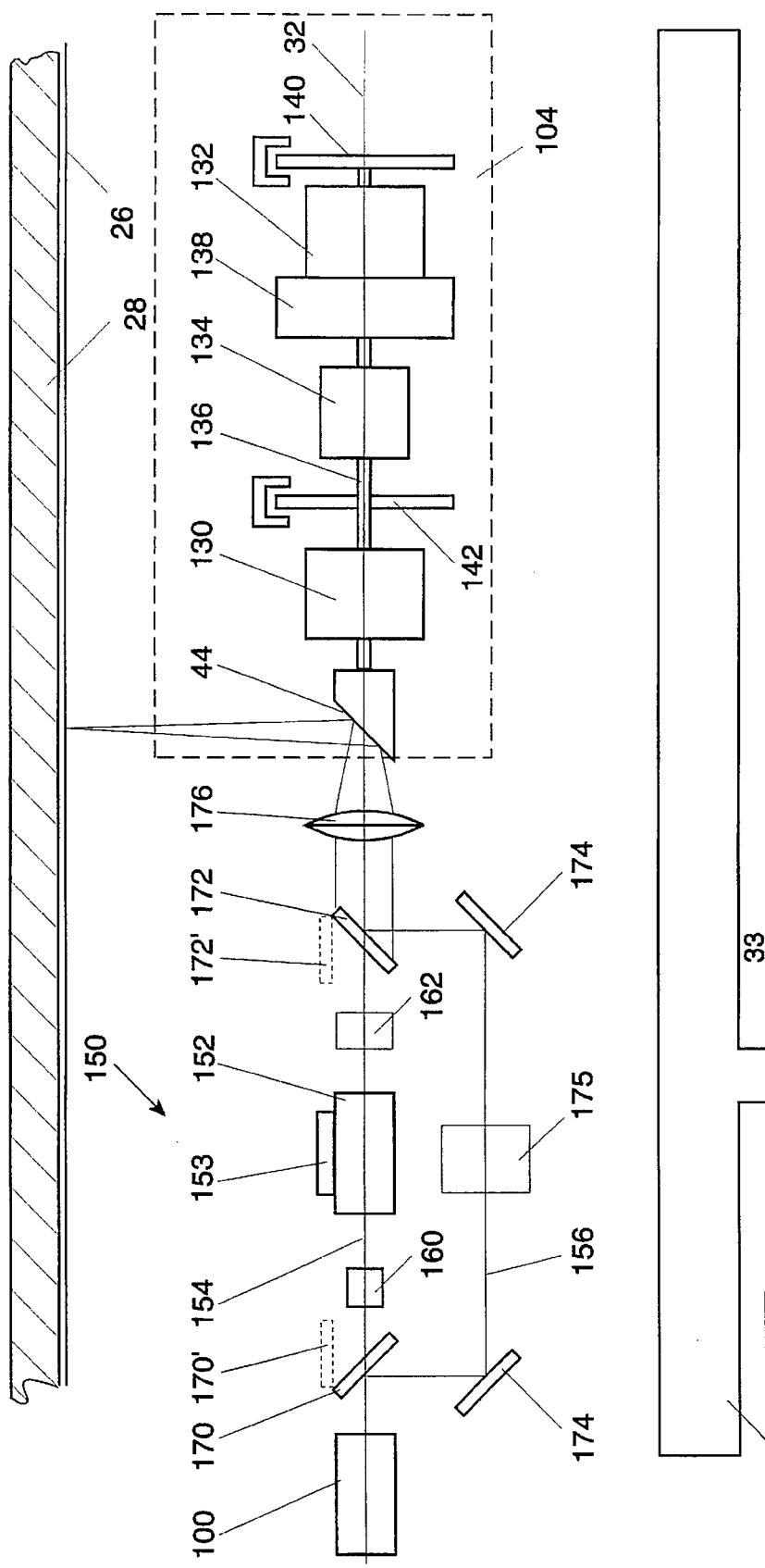
FIG. 6 is a schematic illustration of a second combined plotting and cutting system, constructed and operative in accordance with a third preferred embodiment of the present invention.

Reference is now made to FIG. 6 which schematically illustrates a second alternative embodiment of the present invention also having a single, combined plotting and cutting system. In this embodiment, the system provides two separate wavelengths for the laser beam, a visible wavelength, on the order of 490 nm, for plotting and a much larger wavelength for cutting, on the order of 985 nm. The laser beam is first processed to become a cutting or a plotting beam after which the path which the beam follows is the same for both operations.

Those elements of this embodiment which are similar to those of the previous embodiments have the same reference numerals and will not be described in detail.

In this third embodiment, the system comprises dual mode beam frequency changing (wavelength changing) apparatus 150 for separately providing two beam frequencies, one for plotting and one for cutting. The frequency changing apparatus 150 has two initial beam paths, a first, plotting path 154 and a second, cutting path 156. The paths are illustrated schematically, as single lines, rather illustrating the shaping which occurs to the beam as it follows each path. It is noted that the two paths converge prior to being redirected towards the drum 28.

The plotting path 154 typically passes through a potassium niobate crystal 152 for generating second harmonics of the frequency of the initial laser beam. For example, it can double the frequency (equivalent to halving the wavelength) of the laser beam to the smaller wavelength in the visible range. Crystal 152 is typically cooled by a thermoelectric cooler 153.

Plotting path 154 also passes through two sets of optics, one each before and after the crystal 152. The first set of optics, labeled 160, receives the laser beam directly from the laser source 100, and focuses it into the crystal 152. The second set of optics, labeled 162, expands and filters the wavelength reduced beam received from the crystal 152 and provides it to a lens 176, similar to lens 42, for focusing the laser beam onto the medium 26. The sets of optics 160 and 162 can comprise any suitable optical elements which will perform the functions described hereinabove.

Lens 176 is achromatic and is optimized for the two wavelengths operative in the present system.

It is noted that the crystal 152 has a relatively low conversion efficiency. Thus, if the incoming beam is red and the outgoing beam should be yellow, part of the outgoing beam is still red. Therefore, the second set of optics 162 typically includes a filter for filtering out the undesired non-converted portion of the outgoing beam.

In the conversion, the crystal 152 reduces the energy of the beam. However, since the laser source provides a 1 W beam whereas plotting requires only 3 mW, the loss does not affect the quality of the plotting. In fact, the beam produced by the crystal 152 typically has more than 3 mW of power. Therefore, if desired, the second set of optics 162 can additionally comprise a neutral density (ND) filter for reducing the energy of the laser beam to an energy closer to that needed for plotting.

Cutting path 156 shapes the laser beam from laser source 100 and directs it around the crystal 152. The redirection is typically provided by mirrors 170,172 and 174 and the shaping is provided by optics 175, comprised of those optical elements which can provide the necessary shaping. Mirrors 170 and 172 are rotatable and are in place, as shown, only during cutting. The states of the mirrors during plotting, labeled 170' and 172', are illustrated in FIG. 6 with dotted lines.

Alternatively, mirror 172 can be replaced with a fixed location, interference filter (not shown) which receives the beams of both paths 154 and 156 and redirects them along the main optical axis 32, to dual wavelength lens 176.

The paths 154 and 156 provide the plotting or cutting beam, respectively, to the lens 176 which focusses the beam. As in the previous embodiments, the mirror 44 directs the plotting or cutting beam towards the medium 26. Thus, after processing to become a cutting or plotting beam, the laser beam follows a single path to the medium 26.

The remaining elements (i.e. the dual mode cutting beam scanning apparatus 104 and the translation apparatus 30) of the plotter of the third embodiment are the same as those described hereinabove with respect to the second embodiment and they operate in a similar manner.

Figure 7:
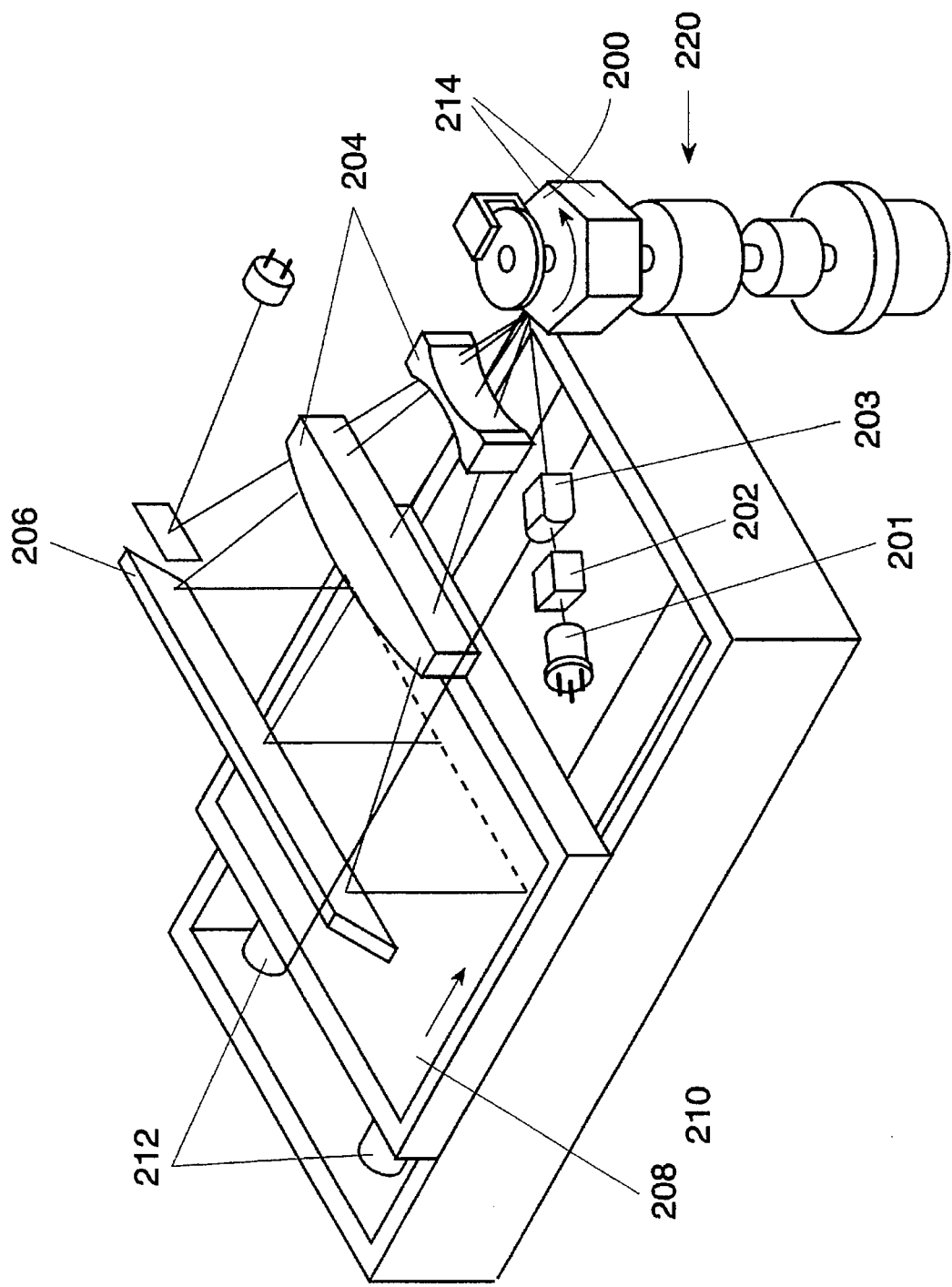
FIG. 7 is a schematic illustration of a third combined plotting and cutting system implemented in a flat bed plotter.

Reference is now briefly made to FIG. 7 which illustrates a combined plotting and cutting system implemented in a flat bed plotter.

A flat bed plotter typically comprises a laser source 201, an optical system 202 and a lens 203 for shaping the laser beam, a spinner 200 having a plurality of facets 214 for scanning the laser beam, an f-theta lens 204 after the spinner 200 and a mirror 206 after the f-theta lens 204 for directing the scanned laser beam toward the medium 208. The medium 208 typically is placed on a stage 210 which is translated by translation apparatus 212, typically formed of two lead screws.

In the present embodiment, the laser source 201 is a MOPA laser diode, as described hereinabove, and the optical system 202 can be either of those shown in FIGS. 4 and 6 and described as the second and third embodiments. The spinner 200 is operated by a dual mode cutting beam scanning apparatus 220 similar to apparatus 104 of FIG. 4.

It is noted that, for both plotting and cutting, the optical path remains the same.

During plotting, the plotter operates as a prior art flat bed plotter. As such, the spinner 200 continually rotates wherein each of its facets 214 provides scanning along one line of the medium 208. After one line has been scanned, the translation apparatus 212 translates the stage 210 by the width of one scanned line.

During cutting, the beam directing apparatus 220 operates the spinner 200 with one facet 214 only, moving it back and forth to desired locations, thereby to provide movement in the scan or X direction (FIG. 3A). The translation apparatus 212 also moves back and forth to desired locations, thereby to provide movement in the cross-scan or Y direction.

It will be appreciated by persons skilled in the art that the present invention is not limited to what has been particularly shown and described hereinabove. Rather the scope of the present invention is defined by the claims which follow:

I claim:

1. A laser plotter comprising:
   laser plotting means for plotting artwork onto a plotting medium, said laser plotting means comprising plotting beam scanning apparatus having a first axis of rotation; and
   laser cutting means for cutting holes in said plotting medium in registration with said artwork, said laser cutting means comprising cutting beam scanning apparatus having a second axis of rotation,
   wherein said first and second axes of rotation are the same;
   a single laser source, wherein said laser plotting means and said laser cutting means are combined; and
   a dual mode beam scanning apparatus for selectively scanning said cutting beam and said plotting beam, said dual mode beam scanning apparatus comprises:
   a scanning element;
   a first motor for use during cutting;
   a second motor for use during plotting having an axle, wherein said axle is attached to said scanning element; and
   a coupling for coupling said first motor to said axle during cutting.

2. A laser plotter according to claim 1 and wherein said single laser source is a master oscillator/power amplifier (MOPA) laser diode.

3. A laser plotter according to claim 1 and comprising a beam processing unit for selectively providing a cutting beam and a plotting beam from an output of said single laser source.

4. A laser plotter according to claim 3 and characterized in that said laser cutting and laser plotting means direct said cutting and plotting beams along generally the same optical path.

5. A laser plotter according to claim 3 and wherein said beam processing unit comprises a beam frequency changer for selectively producing a plotting beam having a different frequency than an input cutting beam.

6. A laser plotter according to claim 5 and wherein said beam frequency changer comprises a crystal for producing said plotting beam.

7. A laser plotter according to claim 6 and wherein said crystal provides on output one of the second and third harmonics of an input cutting beam.

8. A laser plotter according to claim 3 and wherein said beam processing unit comprises a beam spot size changer for selectively producing a plotting beam having a large spot size and a cutting beam having a small spot size.

9. A laser plotter according to claim 8 and wherein said plotting medium is heat sensitive.

10. A laser plotter according to claim 1 and including a translation apparatus, wherein said first motor and said translation apparatus provide vector motion and said second motor and said translation apparatus provide raster motion.

11. A laser plotter according to claim 1 having a plotting and cutting area and comprising waste removal means located away from said plotting and cutting area.

12. A laser plotter according to claim 11 and wherein said waste removal means comprises a cutting edge.

13. A laser plotter according to claim 1 and wherein said laser cutting means is also operative to cut straight lines.

14. A laser plotter comprising:
    a single MOPA laser diode;
    beam processing unit for selectively providing a cutting beam and a plotting beam from the output of said single laser source;
    laser plotting means for directing said plotting beam to plot artwork onto a plotting medium;
    laser cutting means for directing said cutting beam to cut holes in said plotting medium in registration with said artwork;
    wherein said laser plotting and laser cutting means are combined and said cutting and plotting beams follow a single optical path; and
    a dual mode beam scanning apparatus for selectively scanning said cutting beam and said plotting beam, said dual mode beam scanning apparatus comprises:
    a scanning element;
    a first motor for use during cutting;
    a second motor for use during plotting having an axle, wherein said axle is attached to said scanning element; and
    a coupling for coupling said first motor to said axle during cutting.

15. A laser plotter according to claim 14 and wherein said beam processing unit comprises a beam frequency changer for selectively producing a plotting beam having a smaller frequency than an input cutting beam.

16. A laser plotter according to claim 15 and wherein said beam frequency changer comprises a crystal for producing said plotting beam.

17. A laser plotter according to claim 14 and wherein said beam processing unit comprises a beam spot size changer for selectively producing a plotting beam having a large spot size and a cutting beam having a small spot size.

18. A laser plotter according to claim 14 wherein said laser cutting means is also operative to cut straight lines.

19. A laser plotter comprising:
    at least one laser source and associated optics for producing a scanning beam;
    raster scanning means for scanning said scanning beam with a raster motion;
    vector scanning means for scanning said scanning beam with a vector motion;
    a single laser source, wherein said raster scanning means and said vector scanning means are combined; and
    a dual mode beam scanning apparatus for selectively performing raster and vector scanning, said dual mode beam scanning apparatus comprises:
    a scanning element;
    a first motor having an axle attached to said scanning element;
    a second motor;
    a coupling for coupling said second motor to said axle; and
    translation means having a carriage on which lie said first and second motors, said coupling and said scanning element for translating said carriage, wherein said second motor and said translation apparatus provide vector motion and said first motor and said translation apparatus provide raster motion.

20. A laser plotter according to claim 19 and wherein said single laser source is a MOPA laser diode.

* * * * *